(12) United States Patent
Choe et al.

(10) Patent No.: US 10,644,088 B2
(45) Date of Patent: May 5, 2020

(54) METHOD OF MANUFACTURING ORGANIC LIGHT-EMITTING DISPLAY APPARATUS

(71) Applicant: SAMSUNG DISPLAY CO., LTD., Yongin-si, Gyeonggi-do (KR)

(72) Inventors: Wonkyu Choe, Yongin-si (KR); Duckjung Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/128,700

(22) Filed: Sep. 12, 2018

(65) Prior Publication Data

US 2019/0013375 A1 Jan. 10, 2019

Related U.S. Application Data

(62) Division of application No. 15/156,493, filed on May 17, 2016, now Pat. No. 10,079,274.

(30) Foreign Application Priority Data

Aug. 7, 2015 (KR) .................. 10-2015-0111632

(51) Int. Cl.
*H01L 27/32* (2006.01)
*H01L 51/50* (2006.01)
(Continued)

(52) U.S. Cl.
CPC ...... *H01L 27/3258* (2013.01); *H01L 27/3211* (2013.01); *H01L 27/3246* (2013.01);
(Continued)

(58) Field of Classification Search
CPC .......... H01L 2227/323; H01L 27/3211; H01L 27/3246; H01L 27/3258; H01L 51/5056;
(Continued)

(56) References Cited

U.S. PATENT DOCUMENTS 8,860,299 B2 * 10/2014 Seong ................. H01L 51/5253
  313/504
9,356,078 B2 * 5/2016 Han ..................... H01L 27/3246
(Continued)

FOREIGN PATENT DOCUMENTS

JP 2007-165215 A 6/2007
JP 4701971 3/2011
(Continued)

OTHER PUBLICATIONS

EPO Examination Report corresponding to European Application No. 16 183 263.9, dated Oct. 2, 2019.
(Continued)

*Primary Examiner* — Mohammed Shamsuzzaman
(74) *Attorney, Agent, or Firm* — Kile Park Reed & Houtteman PLLC

(57) ABSTRACT

An organic light-emitting display apparatus, including a pixel electrode; a pixel definition layer covering at least a portion of an edge of the pixel electrode; an emission layer on the pixel electrode; and a first intermediate layer on the pixel electrode and the pixel definition layer, the first intermediate layer having a first through hole corresponding to at least a portion of an upper surface of the pixel definition layer.

8 Claims, 14 Drawing Sheets

(51) Int. Cl.
*H01L 51/52* (2006.01)
*H01L 51/56* (2006.01)

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5237* (2013.01); *H01L 51/56* (2013.01); *H01L 2227/323* (2013.01)

(58) Field of Classification Search
CPC ............. H01L 51/5072; H01L 51/5088; H01L 51/5092; H01L 51/5237; H01L 51/56
See application file for complete search history.

(56) References Cited

U.S. PATENT DOCUMENTS

| | | | | |
|---|---|---|---|---|
| 9,502,480 | B2* | 11/2016 | Kim | H01L 27/3246 |
| 9,508,778 | B2* | 11/2016 | Kim | H01L 51/0011 |
| 9,508,788 | B2 | 11/2016 | Kim et al. | |
| 9,614,180 | B2* | 4/2017 | Kang | H01L 27/3246 |
| 2004/0256984 | A1* | 12/2004 | Fuchigami | H01L 27/3246 313/506 |
| 2008/0001535 | A1 | 1/2008 | Kim et al. | |
| 2008/0290790 | A1* | 11/2008 | Jin | H01L 27/3246 313/504 |
| 2009/0078945 | A1 | 3/2009 | Koo | |
| 2010/0052519 | A1* | 3/2010 | Jeon | H01L 27/3246 313/504 |
| 2011/0175123 | A1* | 7/2011 | Koh | H01L 51/5265 257/98 |
| 2013/0248867 | A1* | 9/2013 | Kim | H01L 51/5253 257/59 |
| 2014/0284563 | A1* | 9/2014 | Baek | H01L 51/5203 257/40 |
| 2014/0361261 | A1* | 12/2014 | Choi | H01L 51/5218 257/40 |
| 2015/0008820 | A1 | 1/2015 | Lee | |
| 2015/0014636 | A1 | 1/2015 | Kang | |
| 2015/0021568 | A1* | 1/2015 | Gong | H01L 51/5246 257/40 |
| 2015/0279915 | A1 | 10/2015 | Morita et al. | |
| 2017/0186819 | A1* | 6/2017 | Yun | H01L 27/322 |
| 2017/0194396 | A1* | 7/2017 | Choe | H01L 27/3211 |
| 2018/0358584 | A1* | 12/2018 | Jeong | H01L 51/0018 |

FOREIGN PATENT DOCUMENTS

| | | |
|---|---|---|
| KR | 10-2001-0003747 A | 1/2001 |
| KR | 10-2009-0031147 A | 3/2009 |
| KR | 10-2014-0019341 A | 2/2014 |
| KR | 10-2014-0140870 A | 12/2014 |
| KR | 10-2015-0005264 A | 1/2015 |
| KR | 10-2015-0007866 A | 1/2015 |
| KR | 10-2015-0113848 A | 10/2015 |

OTHER PUBLICATIONS

Action dated Dec. 8, 2016, in the examination of European Patent Application No. 16183263.9.
Action dated Dec. 20, 2016, in the examination of Korean Patent Application No. 10-2015-0111632.
Action dated Jun. 12, 2017, in the examination of Korean Patent Application No. 10-2015-0111632.
Action dated Nov. 16, 2017, in the examination of Korean Patent Application No. 10-2015-0111632.

* cited by examiner

METHOD OF MANUFACTURING ORGANIC LIGHT-EMITTING DISPLAY APPARATUS

CROSS-REFERENCE TO RELATED APPLICATIONS

This is a divisional application based on pending application Ser. No. 15/156,493, filed May 17, 2016, the entire contents of which is hereby incorporated by reference.

Korean Patent Application No. 10-2015-0111632, filed on Aug. 7, 2015, in the Korean Intellectual Property Office, and entitled: "Organic Light-Emitting Display Apparatus and Method of Manufacturing the Same," is incorporated by reference herein in its entirety.

BACKGROUND

1. Field

One or more embodiments relate to organic light-emitting display apparatuses and methods of manufacturing the organic light-emitting display apparatuses.

2. Description of the Related Art

An organic light-emitting display apparatus is a display apparatus that may include an organic-light-emitting diode (OLED) in a display region. The OLED may include a pixel electrode and an opposite electrode that face each other, and an intermediate layer disposed between the pixel and opposite electrodes and including an emission layer.

SUMMARY

Embodiments may be realized by providing an organic light-emitting display apparatus, including a pixel electrode; a pixel definition layer covering at least a portion of an edge of the pixel electrode; an emission layer on the pixel electrode; and a first intermediate layer on the pixel electrode and the pixel definition layer, the first intermediate layer having a first through hole corresponding to at least a portion of an upper surface of the pixel definition layer.

A portion of the first intermediate layer that corresponds to the pixel electrode may be between the pixel electrode and the emission layer.

The organic light-emitting display apparatus may further include a second intermediate layer over the pixel electrode and the pixel definition layer, the second intermediate layer having a portion corresponding to the pixel electrode on the emission layer.

The second intermediate layer may have a second through hole corresponding to the first through hole.

An inner surface of the first through hole and an inner surface of the second through hole may form a continuous surface.

The organic light-emitting display apparatus may further include an opposite electrode on the second intermediate layer, the opposite electrode facing the pixel electrode and the pixel definition layer.

The opposite electrode may have a third through hole corresponding to the second through hole.

An inner surface of the first through hole, an inner surface of the second through hole, and an inner surface of the third through hole may form a continuous surface.

The organic light-emitting display apparatus may further include a thin film encapsulation layer over the opposite electrode. At least a portion of a lower surface of the thin film encapsulation layer may directly contact the pixel definition layer via the first through hole, the second through hole, and the third through hole.

The thin film encapsulation layer may include an inorganic layer, and the inorganic layer may directly contact the pixel definition layer.

The emission layer may be between the pixel electrode and a portion of the first intermediate layer that corresponds to the pixel electrode.

The organic light-emitting display apparatus may further include an opposite electrode on the first intermediate layer, the opposite electrode facing the pixel electrode and the pixel definition layer.

The opposite electrode may have a third through hole corresponding to the first through hole.

An inner surface of the first through hole and an inner surface of the third through hole may form a continuous surface.

Embodiments may be realized by providing a method of manufacturing an organic light-emitting display apparatus, the method including forming a pixel electrode; forming a pixel definition layer covering at least a portion of an edge of the pixel electrode; forming a patterned sacrificial layer to correspond to at least a portion of an upper surface of the pixel definition layer; forming a patterned emission layer to correspond to the pixel electrode, using the patterned sacrificial layer as a spacer; and removing the patterned sacrificial layer.

Forming the patterned sacrificial layer may include forming a sacrificial layer to correspond to the pixel electrode and the pixel definition layer; and forming a patterned sacrificial layer by forming a photoresist layer on the sacrificial layer and by patterning the sacrificial layer using the photoresist layer.

Removing the patterned sacrificial layer may include removing a portion of the photoresist layer remaining on the patterned sacrificial layer by removing the patterned sacrificial layer.

The method may further include forming a first intermediate layer corresponding to the pixel electrode and the pixel definition layer, the intermediate layer having a first through hole corresponding to the patterned sacrificial layer, between forming the patterned sacrificial layer and forming the patterned emission layer.

The method may further include forming a second intermediate layer corresponding to the pixel electrode and the pixel definition layer, the intermediate layer having a second through hole corresponding to the patterned sacrificial layer, to cover the patterned emission layer.

The method may further include forming an opposite electrode corresponding to the pixel electrode and the pixel definition layer, the opposite electrode having a third through hole corresponding to the patterned sacrificial layer, to cover the second intermediate layer.

The method may further include forming, over the opposite electrode, a thin film encapsulation layer of which at least a portion of a lower surface directly contacts the pixel definition layer via the first through hole, the second through hole, and the third through hole.

The patterned sacrificial layer may include highly-fluorinated resin or fluorinated polymer containing 20 wt % to 60 wt % fluorine.

Removing the patterned sacrificial layer may include using hydrofluoroethers.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
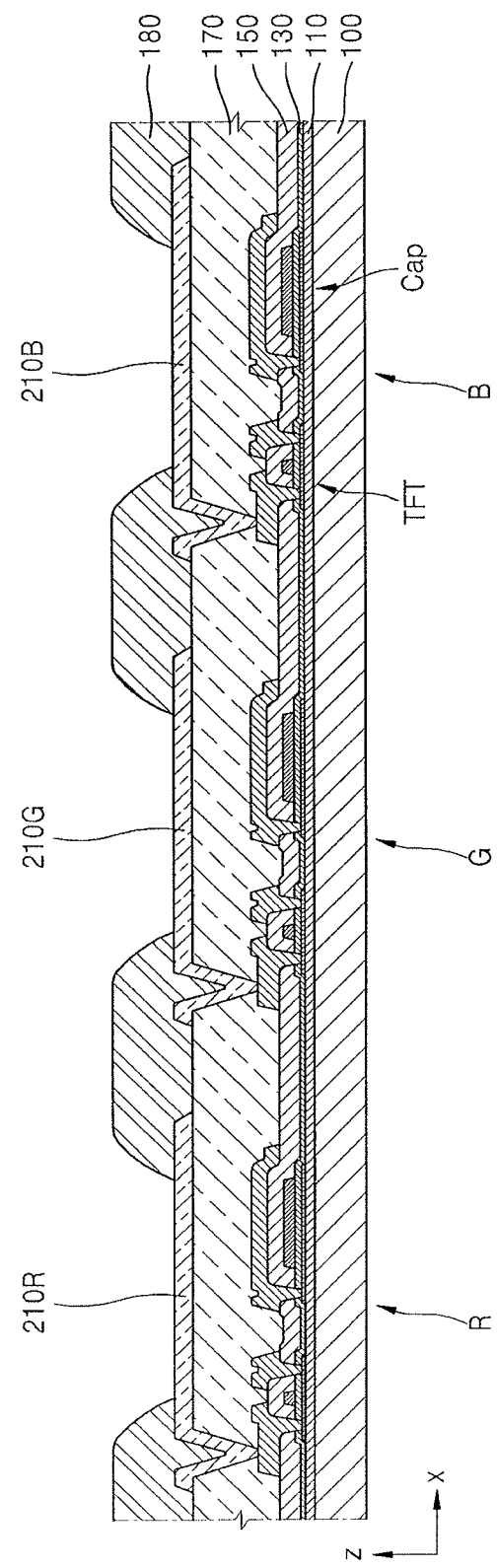
FIGS. 1-8 illustrate schematic cross-sectional views of a method of manufacturing an organic light-emitting display apparatus, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

One or more embodiments will be described below in more detail with reference to the accompanying drawings. Those components that are the same or are in correspondence are rendered the same reference numeral regardless of the figure number, and redundant explanations are omitted.

It will be understood that, unless otherwise specified, when an element such as a layer, film, region or substrate is referred to as being "on" another element, it can be "directly" on the other element or intervening elements may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In the drawings, the thicknesses of layers and regions may be exaggerated or minimized for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIGS. 1-8 illustrate schematic cross-sectional of a method of manufacturing an organic light-emitting display apparatus, according to an embodiment.

First, as shown in FIG. 1, a backplane may be prepared. The backplane may be understood as including at least a substrate 100, pixel electrodes 210R, 210G, and 210B formed on the substrate 100, and a pixel definition layer 180 exposing at least a portion of each of the pixel electrodes 210R, 210G, and 210B. Each of the portions may include a center portion of each of the pixel electrodes 210R, 210G, and 210B. The pixel definition layer 180 may cover at least a portion of an edge of each of the pixel electrodes 210R, 210G, and 210B. The pixel definition layer 180 may protrude farther than the pixel electrodes 210R, 210G, and 210B (in a +z direction) with respect to the substrate 100.

For example, the pixel electrodes 210R, 210G, and 210B may be formed on a planarization layer 170, which may be considered to be a lower layer, and the pixel definition layer 180 may be formed on the planarization layer 170, which may be a lower layer located below the pixel electrodes 210R, 210G, and 210B. The pixel definition layer 180 may be formed such that a height of the pixel definition layer 180, ranging from the planarization layer 170 to an upper surface of the pixel definition layer 180, is greater than that from the planarization layer 170 to upper surfaces of the pixel electrodes 210R, 210G, and 210B.

The pixel electrodes 210R, 210G, and 210B may be (semi-)transparent electrodes or reflective electrodes. When the pixel electrodes 210R, 210G, and 210B are (semi-)transparent electrodes, the pixel electrodes 210R, 210G, and 210B may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210R, 210G, and 210B are reflective electrodes, each of the pixel electrodes 210R, 210G, and 210B may include, for example, a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination thereof, and a layer including ITO, IZO, ZnO, or $In_2O_3$. In an embodiment, structures and materials of the pixel electrodes 210R, 210G, and 210B may be variously modified.

The pixel definition layer 180 may include openings corresponding to sub-pixels, namely, openings via which respective central portions or entire portions of the pixel electrodes 210R, 210G, and 210B may be exposed, and pixels may be defined. The pixel definition layer 180 may also increase a distance between an end of each of the pixel electrodes 210R, 210G, and 210B and an opposite electrode formed on each of the pixel electrodes 210R, 210G, and 210B, and an arc, for example, may be prevented from occurring at the end of each of the pixel electrodes 210R, 210G, and 210B. The pixel definition layer 180 may include various materials, for example, an inorganic material, such as, silicon nitride, silicon oxide, or silicon oxynitride, and an organic material, such as, acryl or polyimide.

In an embodiment, the backplane may further include other components. For example, as shown in FIG. 1, a thin-film transistor TFT or a capacitor Cap may be formed on the substrate 100. The backplane may further include, for example, a buffer layer 110 that may prevent permeation of impurities into a semiconductor layer of the thin-film transistor TFT, a gate insulation layer 130 that may insulate the semiconductor layer of the thin-film transistor TFT from a gate electrode, an interlayer insulation layer 150 that may insulate source and drain electrodes of the thin-film transistor TFT from the gate electrode, and the planarization layer 170 that may cover the thin-film transistor TFT and may have an approximately flat top surface.

Figure 2:
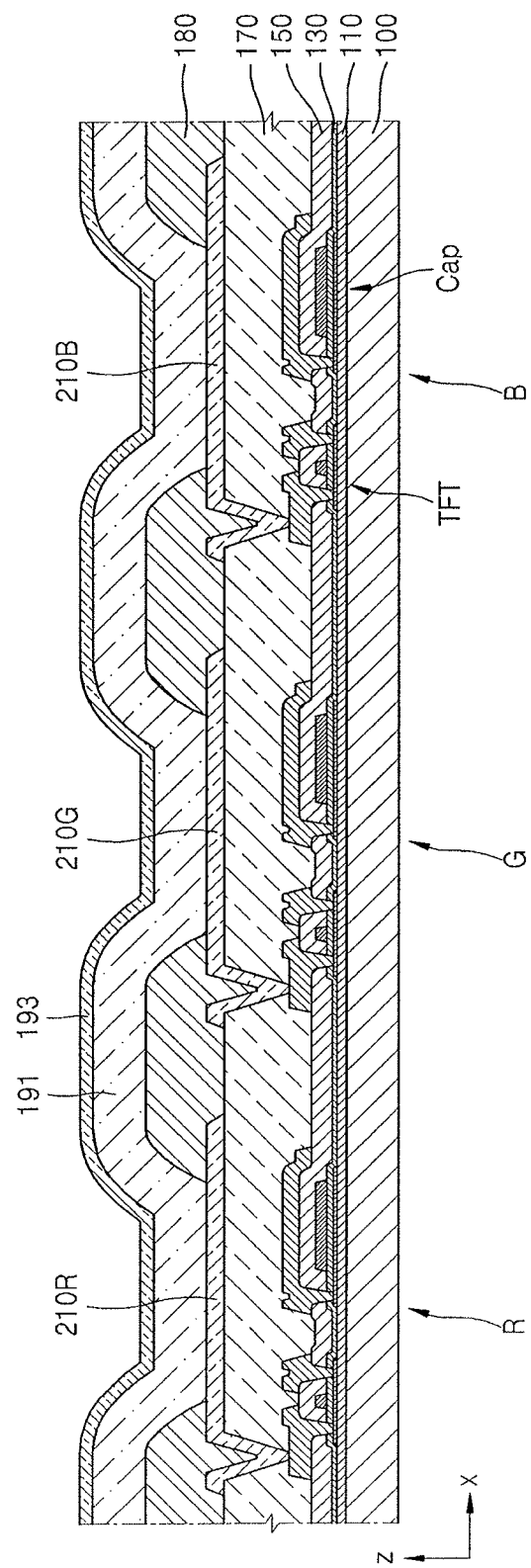
Figure 3:
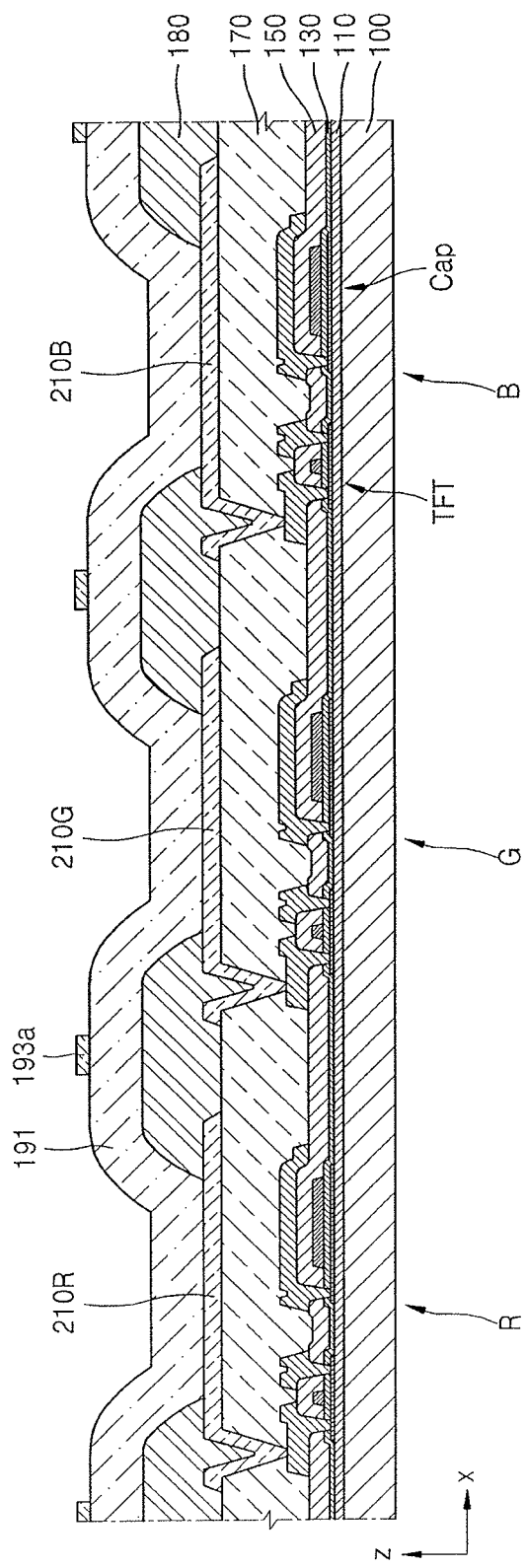
Figure 4:
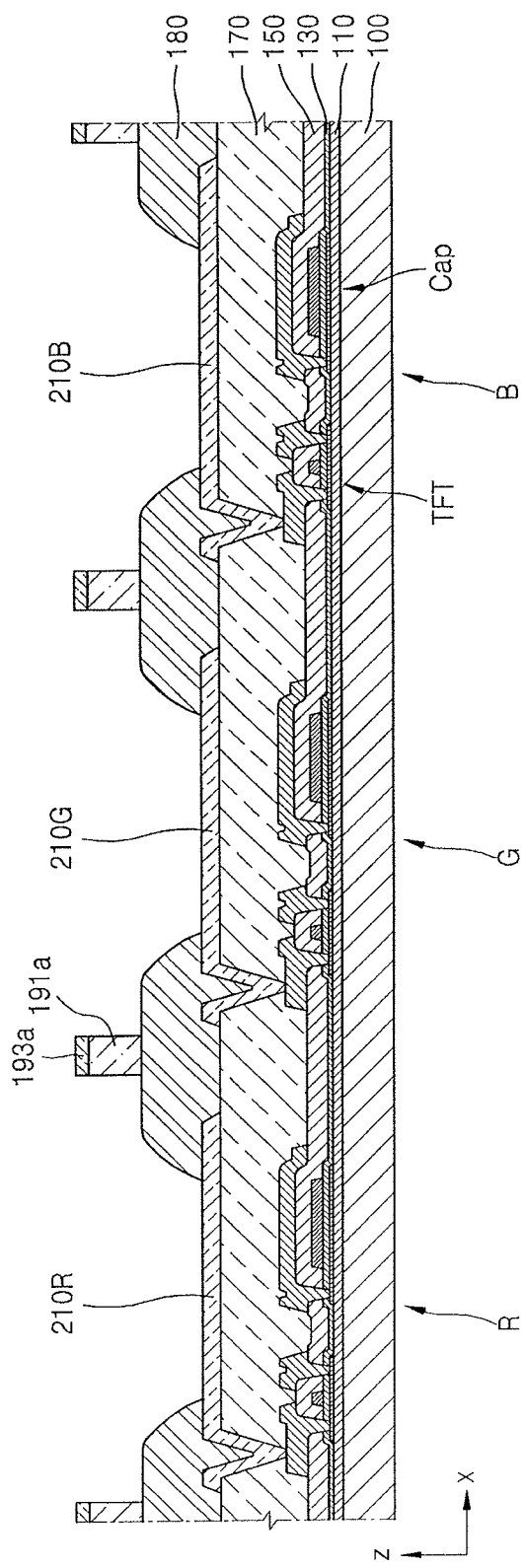

Thereafter, as shown in FIG. 4, a patterned sacrificial layer 191a may be formed on the pixel definition layer 180 and may correspond to at least a portion of the upper surface of the pixel definition layer 180. First, as shown in FIG. 2, a sacrificial layer 191 may be formed over the pixel electrodes 210R, 210G, and 210B and the pixel definition layer 180, and a photoresist layer 193 may be formed on the sacrificial layer 191. Thereafter, as shown in FIG. 3, a portion of the photoresist layer 193 may be exposed and developed, and a patterned photoresist layer 193a may be formed on a portion of the sacrificial layer 191 from which a patterned sacrificial layer 191a may be formed. By patterning the sacrificial layer 191 by using the patterned photoresist layer 193a as a mask, the patterned sacrificial layer 191a may be formed. The patterned photoresist layer 193a may be on the patterned sacrificial layer 191a, and the patterned photoresist layer 193a may not need to be removed at this stage. A material for forming the patterned sacrificial layer 191a will be described later.

Figure 5:
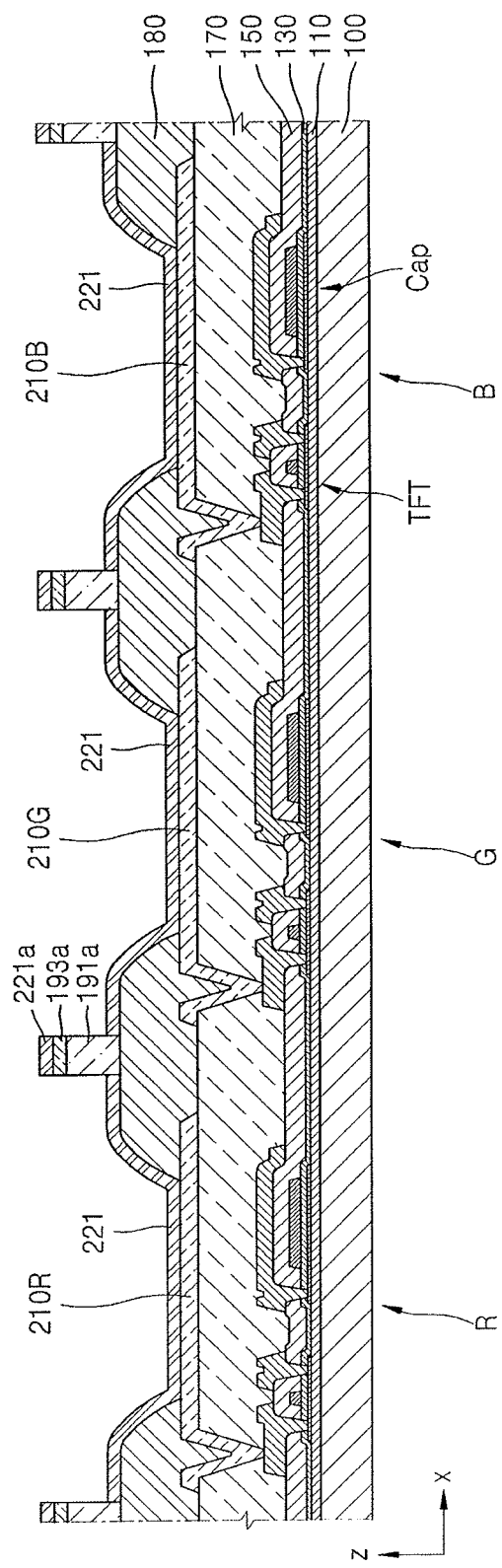

After forming the patterned sacrificial layer 191a, a material for forming a first intermediate layer may be coated, doped, or deposited on the substrate 100 and may correspond to, e.g., overlap, most of the area of the substrate 100. As shown in FIG. 5, a first intermediate layer 221 may be formed, corresponding to, e.g., overlapping, the pixel electrodes 210R, 210G, and 210B and the pixel definition layer 180 and having a first through hole 221b (see FIG. 9) corresponding to, e.g., overlapping, the patterned sacrificial layer 191a. As shown in FIG. 5, a material layer 221a for first intermediate layers may be on the patterned photoresist layer 193a on the patterned sacrificial layer 191a. The first intermediate layer 221 having the first through hole 221b may have a single-layered or multi-layered structure, and may include, for example, a hole injection layer and/or a hole transport layer.

For reference, in an embodiment, the thickness of the material layer 221a for first intermediate layers may be comparable to that of the patterned sacrificial layer 191a or the patterned photoresist layer 193a in FIG. 5 for convenience of explanation. In an embodiment, the material layer 221a for first intermediate layers may actually have a small negligible thickness when being compared with that of the patterned sacrificial layer 191a or the patterned photoresist layer 193a.

Figure 6:
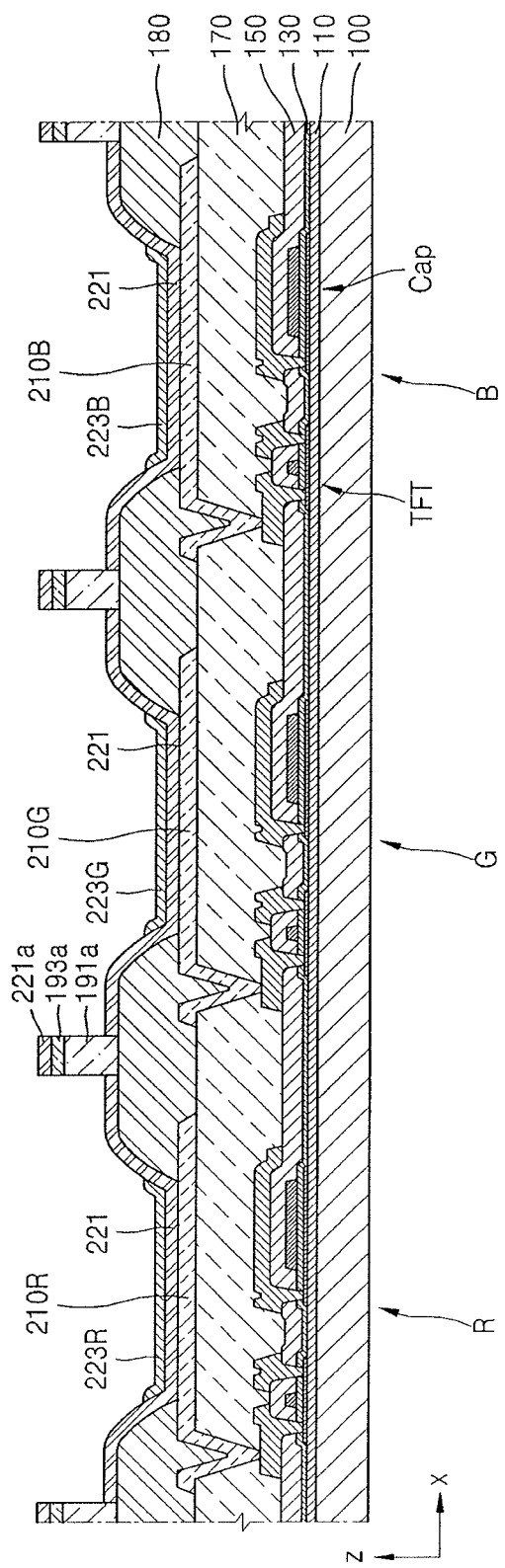

Thereafter, as shown in FIG. 6, a red emission layer 223R, a green emission layer 223G, and a blue emission layer 223B may be formed in a red sub pixel R, a green sub pixel G, and a blue sub pixel B, respectively. Materials that may be used to form the red emission layer 223R, the green emission layer 223G, and the blue emission layer 223B may be different, and the red emission layer 223R, the green emission layer 223G, and the blue emission layer 223B may need to be formed separately. The red emission layer 223R, the green emission layer 223G, and the blue emission layer 223B may be formed using a fine metal mask (FMM). When the red emission layer 223R is formed, an FMM having an opening corresponding to the pixel electrode 210R of the red sub pixel R may be disposed on the substrate 100, and the red emission layer 223R corresponding to the pixel electrode 210R of the red sub pixel R may be formed via deposition. The same method may be applied when the green emission layer 223G or the blue emission layer 223B is formed. The red emission layer 223R, the green emission layer 223 G, and the blue emission layer 223B may be understood as a patterned red emission layer, a patterned green emission layer, and a patterned blue emission layer.

As for pixel electrodes 210R of a plurality of red sub pixels R, a single red emission layer 223R may be formed. The red emission layer 223R may correspond to the pixel electrodes 210R of the plurality of red sub pixels R in a line. An FMM having an stripe-shaped opening corresponding to the pixel electrodes 210R of the plurality of red sub pixels R may be disposed on the substrate 100, and the single red emission layer 223R corresponding to the pixel electrodes 210R of the red sub pixels R may be formed via deposition. The same method may be applied when the green emission layer 223G or the blue emission layer 223B is formed. As such, a patterning shape of an emission layer may vary. This explanation may be equally applied to embodiments to be described later or modifications thereof.

While the red emission layer 223R, the green emission layer 223G, or the blue emission layer 223B is being formed as described above, the FMM may contact the patterned sacrificial layer 191a, for example, the patterned photoresist layer 193a or the material layer 221a for first intermediate layers on the patterned sacrificial layer 191a. For example, an interval between the FMM and each of the pixel electrodes 210R, 210G, and 210B may need to be a preset constant interval when the red emission layer 223R, the green emission layer 223G, or the blue emission layer 223B is formed, and the FMM may need to contact the patterned sacrificial layer 191a, for example, the patterned photoresist layer 193a or the material layer 221a for first intermediate layers on the patterned sacrificial layer 191a.

The FMM may not contact the pixel definition layer 180 or the first intermediate layer 221, and the pixel definition layer 180 or the first intermediate layer 221, for example, may not be damaged while the red emission layer 223R, the green emission layer 223G, or the blue emission layer 223B is being formed. Generation of defects during the manufacturing of the organic light-emitting display apparatus may be effectively prevented, or a defect generation rate may be dramatically reduced. The FMM may contact the patterned sacrificial layer 191a, for example, the patterned photoresist layer 193a or the material layer 221a for first intermediate layers on the patterned sacrificial layer 191a as described above, and the patterned sacrificial layer 191a, the patterned photoresist layer 193a, or the material layer 221a for first intermediate layers may be damaged. The patterned sacrificial layer 191a, the patterned photoresist layer 193a, and the material layer 221a for first intermediate layers may be removed as will be described later, and the patterned sacrificial layer 191a, the patterned photoresist layer 193a, or the material layer 221a for first intermediate layers may not affect the quality of the organic light-emitting display apparatus.

Figure 7:
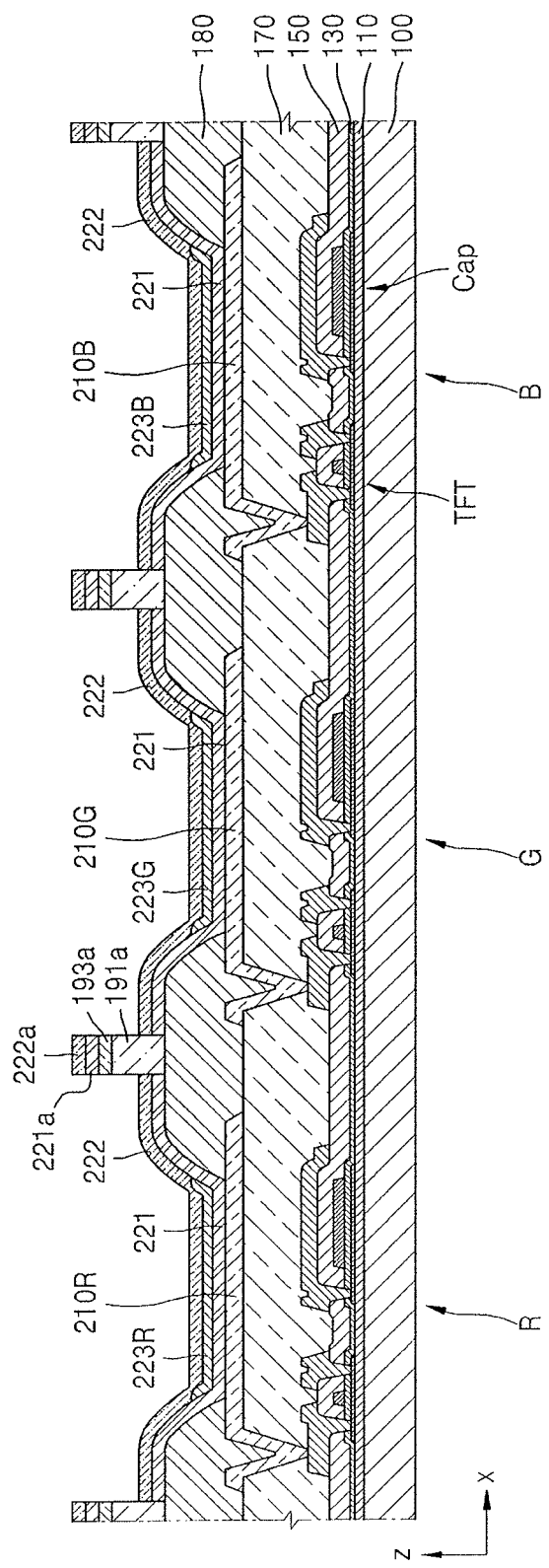

After the patterned red emission layer 223R, the patterned green emission layer 223G, or the patterned blue emission layer 223B is formed to respectively correspond to the pixel electrode 210R, 210G, or 210B by using the patterned sacrificial layer 191a as a spacer, as described above, a material for forming a second intermediate layer may be coated, doped, or deposited to cover the red emission layer 223R, the green emission layer 223G, or the blue emission layer 223B and to correspond to most of the area of the substrate 100, as shown in FIG. 7. As shown in FIG. 7, a second intermediate layer 222 may be formed, corresponding to the pixel electrodes 210R, 210G, and 210B and the pixel definition layer 180 and having a second through hole 222b (see FIG. 9) corresponding to the patterned sacrificial layer 191a. As shown in FIG. 7, a material layer 222a for second intermediate layers may be on the patterned photoresist layer 193a and/or the material layer 221a for first intermediate layers on the patterned sacrificial layer 191a. The second intermediate layer 222 having the second through hole 222b may have a single-layered or multi-layered structure, and may include, for example, an electron transport layer and/or an electron injection layer.

For reference, in an embodiment, the thickness of the material layer 222a for second intermediate layers may be comparable to that of the patterned sacrificial layer 191a or the patterned photoresist layer 193a in FIG. 7 for convenience of explanation. In an embodiment, the material layer 222a for second intermediate layers may actually have a small negligible thickness when being compared with that of the patterned sacrificial layer 191a or the patterned photoresist layer 193a.

Figure 8:
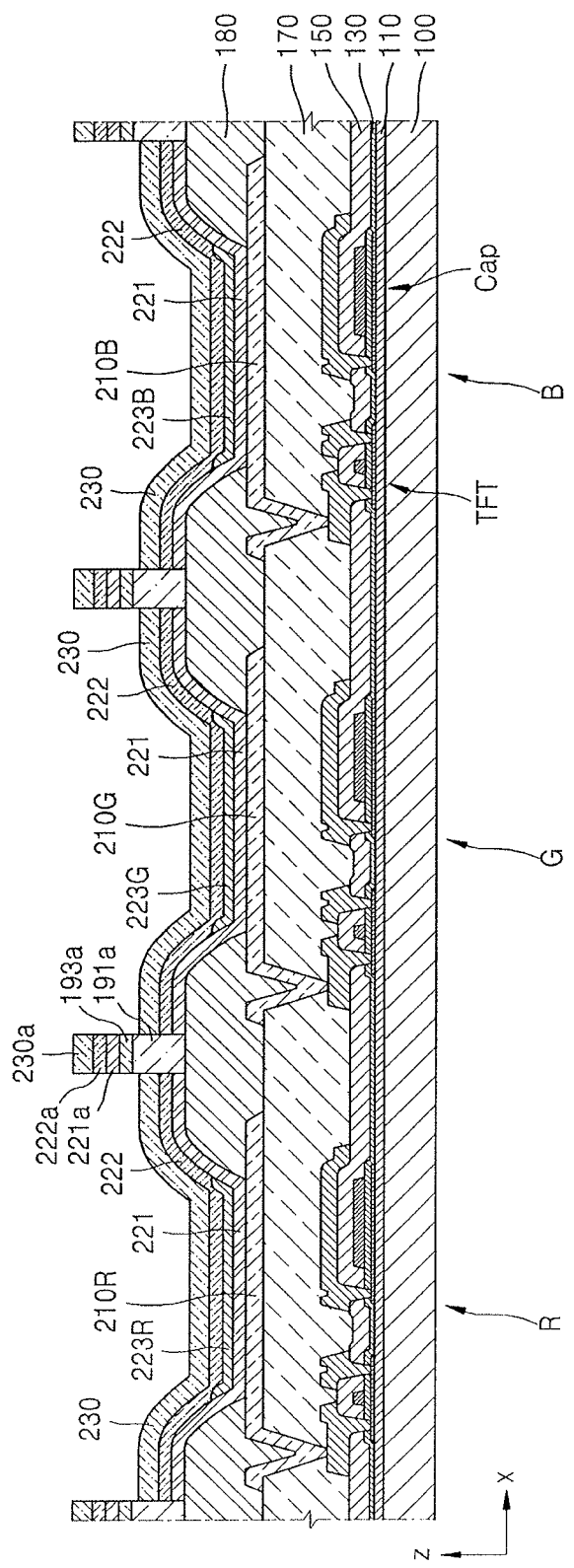

Thereafter, a material for forming an opposite electrode may be coated, doped, or deposited to cover the second intermediate layer 222 and to correspond to most of the area of the substrate 100. As shown in FIG. 8, an opposite electrode 230 may be formed, corresponding to the pixel electrodes 210R, 210G, and 210B and the pixel definition layer 180 and having a third through hole 230b (see FIG. 9) corresponding to the patterned sacrificial layer 191a. As shown in FIG. 8, a material layer 230a for forming an opposite electrode may be on the patterned photoresist layer 193a, the material layer 221a for first intermediate layers, and/or the material layer 222a for second intermediate layers on the patterned sacrificial layer 191a.

The opposite electrode 230 having the third through hole 230b may contact an electrode power supply line outside a display area and may receive an electrical signal from the electrode power supply line. The opposite electrode 230 may include a transparent (or semi-transparent) electrode or a reflective electrode. When the opposite electrode 230 includes a transparent (or semi-transparent) electrode, the opposite electrode 230 may include, for example, a layer formed by depositing Li, Ca, LiF/Ca, LiF/Al, Al, Mg or a compound thereof toward the emission layers 223R, 223G, and 223B, and an auxiliary electrode or a bus electrode line formed of a transparent (or semi-transparent) material such as ITO, IZO, ZnO, or $In_2O_3$. When the opposite electrode 230 includes a reflective electrode, the opposite electrode 230 may include, for example, a layer including at least one of Li, Ca, LiF/Ca, LiF/Al, Al, Ag, and Mg. In an embodiment, various modifications may be made to the configuration of the opposite electrode 230 and the material that may be used to form the opposite electrode 230.

Figure 9:
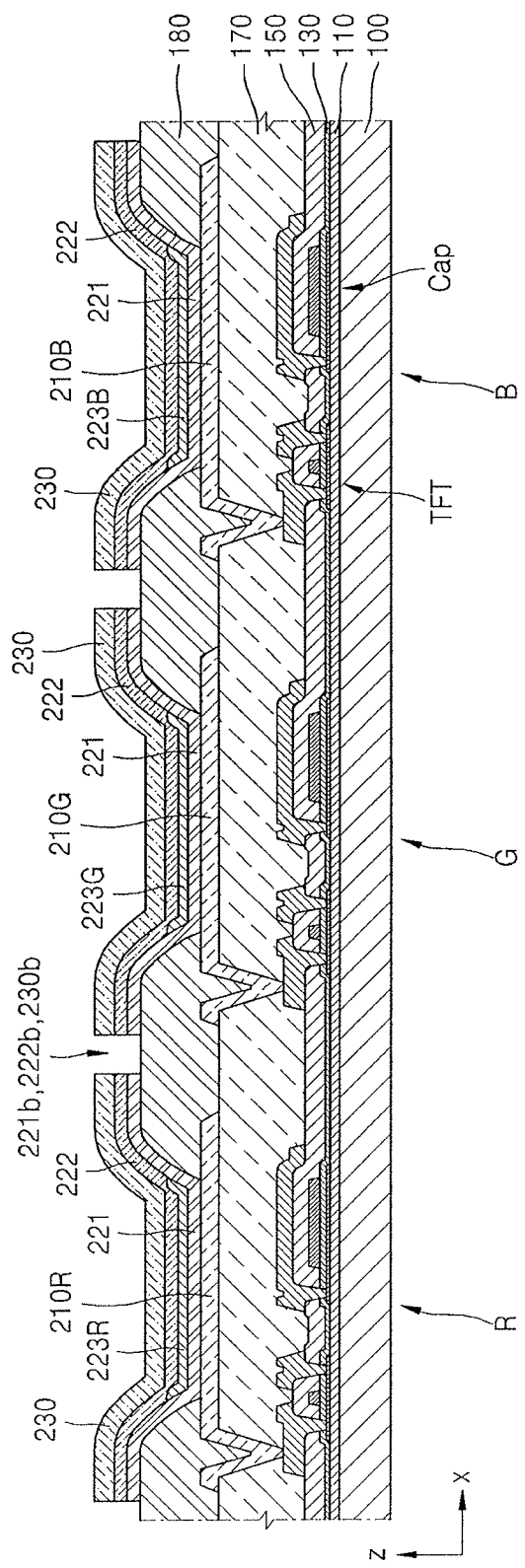
FIG. 9 illustrates a schematic cross-sectional view of an organic light-emitting display apparatus according to an embodiment.

Then, the patterned sacrificial layer 191a may be removed, and an organic light-emitting display apparatus as shown in FIG. 9 may be manufactured. As the sacrificial layer 191a is removed, the patterned photoresist layer 193a, the material layer 221a for first intermediate layers, the material layer 222a for second intermediate layers, and/or the material layer 230a for opposite electrodes on the sacrificial layer 191a may also be removed. A thin film encapsulation (TFE) layer 240 (see FIG. 10) covering the opposite electrode 230 may then be formed, or an encapsulation substrate directly or indirectly connected to the substrate 100 may be disposed such that, for example, the opposite electrode 230, is interposed between the substrate 100 and the encapsulation substrate. Various modifications to this process may be made.

In the organic light-emitting display apparatus manufacturing method according to the present embodiment, an FMM that may be used when the red emission layer 223R, the green emission layer 223G, and the blue emission layer 223B are respectively formed in the red sub pixel R, the green sub pixel G, and the blue sub pixel B may be made in contact with, e.g., may contact, the patterned sacrificial layer 191a, for example, the patterned photoresist layer 193a or the material layer 221a for first intermediate layers on the patterned sacrificial layer 191a, and the red emission layer 223R, the green emission layer 223G, and the blue emission layer 223B may be formed while an interval between the FMM and the substrate 100 may be maintained to be a preset constant interval. The FMM may not contact the pixel definition layer 180 or the first intermediate layer 221 during this process, and, for example, the pixel definition layer 180, or the first intermediate layer 221, which may have already been formed, may not be damaged. Accordingly, generation of defects during the manufacturing of the organic light-emitting display apparatus may be effectively prevented, or a defect generation rate may be dramatically reduced.

After a spacer is formed on the pixel definition layer 180, the spacer may remain. An upper face of the spacer or a material layer existing on the upper surface of the spacer may contact the FMM, and may be damaged. This may cause, for example, generation of defective encapsulation during the formation of the TFE layer 240 (see FIG. 10). Due to, for example, the existence of the spacer, when the TFE layer 240 is formed later, a difference in the height of a stack below the TFE layer 240 may increase, and it may not be easy to form an non-defective TFE layer or the thickness of the TFE layer may excessively increase. In the organic light-emitting display apparatus manufacturing method according to the present embodiment, such generation of a defective encapsulation may be prevented or minimized.

Without forming the patterned sacrificial layer 191a, only a patterned photoresist layer having a shape that may be the same as or similar to the patterned sacrificial layer 191a may be formed. After the red emission layer 223R, the green emission layer 223G, and the blue emission layer 223B are formed, a patterned photoresist layer may need to be removed, and a material that may be used to remove the photoresist layer may severely damage the red emission layer 223R, the green emission layer 223G, and/or the blue emission layer 223B, which may have already been formed.

In the organic light-emitting display apparatus manufacturing method according to the present embodiment, without needing to separately remove the patterned photoresist layer 193a after forming the red emission layer 223R, the green emission layer 223G, and the blue emission layer 223B, when the patterned sacrificial layer 191a is removed, the patterned photoresist layer 193a formed on the patterned sacrificial layer 191a may also be simultaneously removed, and damage of the red emission layer 223R, the green emission layer 223G, and the blue emission layer 223B may be prevented or minimized. When the sacrificial layer 191 is formed and then the patterned photoresist layer 193a is formed as shown in FIG. 3, the sacrificial layer 191 may surround all of the structures below the sacrificial layer 191, and the structures below the sacrificial layer 191 may be prevented from being damaged, or damage of the structures below the sacrificial layer 191 may be minimized.

The first through hole 221b, the second through hole 222b, and the third through hole 230b shown in FIG. 9 may have various shapes. For example, the first through hole 221b, the second through hole 222b, and the third through hole 230b in an xy plane as viewed in a z-axis direction may each have a dot shape or a stripe shape. In an embodiment, the first through hole 221b, the second through hole 222b, and the third through hole 230b in the xy plane as viewed in the z-axis direction may respectively have shapes that respectively surround the pixel electrodes 210R, 210G, and 210B.

Figure 10:
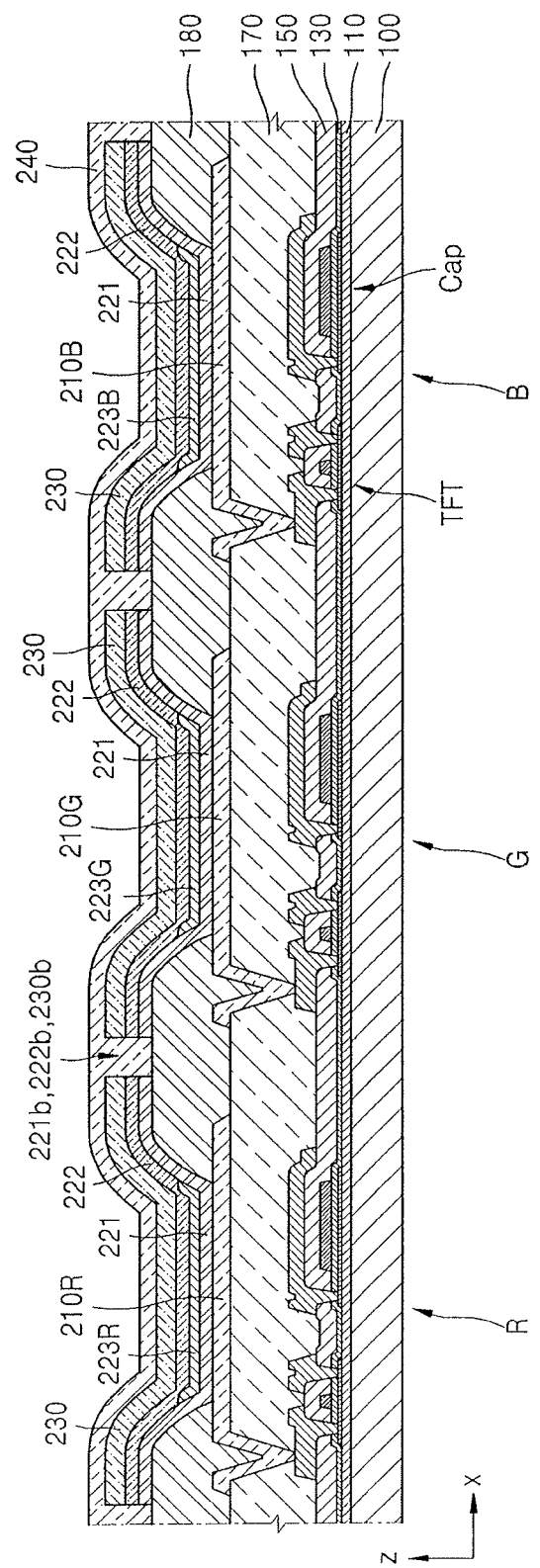
FIG. 10 illustrates a schematic cross-sectional view of an organic light-emitting display apparatus according to an embodiment.

In an organic light-emitting display apparatus manufacturing method according to an embodiment, after the opposite electrode 230 is formed and then the patterned sacrificial layer 191a is removed, the TFE layer 240 may be formed, as shown in FIG. 10. In an organic light-emitting display apparatus manufactured in this way, as shown in FIG. 10, the first intermediate layer 221 may have the first through hole 221b, the second intermediate layer 222 may have the second through hole 222b, and the opposite electrode 230 may have the third through hole 230b. At least a portion of the upper surface of the pixel definition layer 180 may be exposed without being covered by the first intermediate layer 221, the second intermediate layer 222, and the opposite electrode 230. At least a portion of a lower surface of the TFE layer 240 may contact the pixel definition layer 180 via the first through hole 221b, the second through hole 222b, and the third through hole 230b.

The TFE layer 240 may contact the pixel definition layer 180 as described above, bonding power of the TFE layer 240 may increase, and the TFE layer 240 may be effectively prevented from being separated from, for example, the opposite electrode 230. For example, the pixel definition layer 180 may include an inorganic material such as silicon oxide, silicon nitride, and/or silicon oxynitride, and a lowermost layer of the TFE layer 240 having a multi-layered structure may also be formed of an inorganic material, and bonding power between the TFE layer 240 and the pixel definition layer 180 may increase. The TFE layer 240 may include a single inorganic layer. As the first through hole 221b, the second through hole 222b, and the third through hole 340b may exist in a lower structure of the TFE layer 240, an area where a lower surface of the TFE layer 240 may contact the lower structure of the TFE layer 240 may increase, and separation of the TFE layer 240 from the opposite electrode 230 may be prevented. To obtain an effect as described above, the pixel definition layer 180 may include, for example, an inorganic material as described above. In an embodiment, the pixel definition layer 180 may include an organic material.

In the manufacturing process, the patterned sacrificial layer 191a may contact the first intermediate layer 221, the second intermediate layer 222, the red emission layer 223R, the green emission layer 223G, and/or the blue emission layer 223B. The patterned sacrificial layer 191a may need to not damage the first intermediate layer 221, the second intermediate layer 222, the red emission layer 223R, the green emission layer 223G, and/or the blue emission layer 223B, or, even if the patterned sacrificial layer 191a damages the first intermediate layer 221, the second intermediate layer 222, the red emission layer 223R, the green emission layer 223G, and/or the blue emission layer 223B, the degree of the damage may need to be at a minimum. While the patterned sacrificial layer 191a is being removed after the opposite electrode 230 is formed as shown in FIG. 8, damage to the patterned sacrificial layer 191a that may contact the first intermediate layer 221, the second intermediate layer 222, the red emission layer 223R, the green emission layer 223G, and/or the blue emission layer 223B may need to be minimized. Accordingly, a material that may be used to remove the patterned sacrificial layer 191a may need to not greatly affect the first intermediate layer 221, the second intermediate layer 222, the red emission layer 223R, the green emission layer 223G, and/or the blue emission layer 223B.

A material that may be used to form the sacrificial layer 191 may include highly-fluorinated resin or fluorinated polymer (or fluoropolymer) containing 20 wt % to 60 wt % fluorine. This material includes a large amount of fluorinated carbon that does not physically/chemically react with the material of the first intermediate layer 221, the second intermediate layer 222, and/or the red, green, and blue emission layers 223R, 223G, and 223B, and the material may not damage the first intermediate layer 221, the second intermediate layer 222, and/or the emission layers 223R, 223G, and 223B, or, even if damage occurs, the degree of the damage may be minimized.

When the patterned sacrificial layer 191a is formed of this material, bonding power between the patterned sacrificial layer 191a and the pixel definition layer 180 including silicon oxide and/or silicon nitride may be low. Accordingly, the material that may be used to remove the patterned sacrificial layer 191a may not greatly affect the first intermediate layer 221, the second intermediate layer 222, the red emission layer 223R, the green emission layer 223G, and/or the blue emission layer 223B.

Examples of the material that may be used to remove the patterned sacrificial layer 191a may include hydrofluoroethers (HFEs). As a material that may be used to remove the patterned sacrificial layer 191a in the organic light-emitting display apparatus manufacturing method according to the present embodiment, because the material may include HFEs, Novec™ Series products (marketed by 3M™ in the U.S.) may be used. For example, Novec-7100, Novec-7200, Novec-7500, Novec-71IPA, Novec-72DE, or Novec-72DA, or a combination thereof may be used. For reference, chemical formulas of Novec-7100, Novec-7200, and Novec-7500 are as follows.

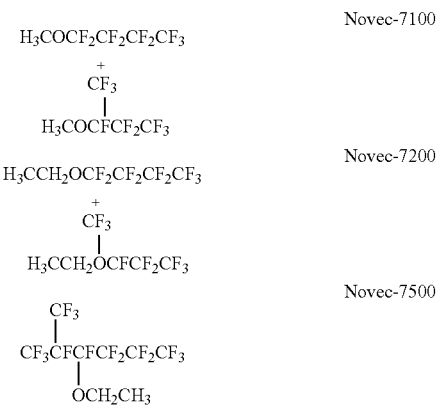

Novec-71IPA may have a composition of Novec-7100 95.5 wt % and isopropanol (IPA) 4.5 wt %, Novec-72DE may have a composition of Novec-7100 10 wt %, Novec-7200 20 wt %, and trans-1,2-dichloroethylene 70 wt %, and Novec-72DA may have a composition of Novec-7100 10 wt %, Novec-7200 20 wt %, trans-1,2-dichloroethylene 68 wt %, and IPA 2 wt %.

In an embodiment, the patterned sacrificial layer 191a may be formed between every two sub pixels in FIGS. 4-8. In an embodiment, the patterned sacrificial layer 191a may be between only some of the sub pixels of an organic light-emitting display apparatus. The patterned sacrificial layer 191a may serve as a spacer that may make an interval between the FMM and the substrate 100 constant during the formation of the second intermediate layer 222, the red emission layer 223R, the green emission layer 223G, and/or the blue emission layer 223B, and the patterned sacrificial layer 191a may not necessarily exist between all of the sub pixels. Thus, although the first through hole 221b, the second through hole 222b, and/or the third through hole 230b corresponding to the patterned sacrificial layer 191a may be formed between every two sub pixels in FIG. 9, the first through hole 221b, the second through hole 222b, and/or the third through hole 230b may be formed between only some of the sub-pixels. This is equally applied to embodiments to be described later and modifications thereof.

The patterned sacrificial layer 191a may have any of various shapes. For example, as viewed in a direction (−z direction) perpendicular to the substrate 100, the patterned sacrificial layer 191a may have a circular shape or a polygonal shape. In an embodiment, as viewed in the direction (−z direction) perpendicular to the substrate 100, the patterned sacrificial layer 191a may have a long single-body shape extending in a y direction, for example, between a plurality of pixels. The first through hole 221b, the second through hole 222b, and/or the third through hole 230b may have a shape extending in the y direction, for example, between a plurality of pixels. This is equally applied to embodiments to be described later and modifications thereof.

An organic light-emitting display apparatus manufactured in this way is shown in FIG. 9. An organic light-emitting display apparatus according to an embodiment may include the pixel electrodes 210R, 210G, and 210B, the pixel definition layer 180 having a shape as described above, the emission layers 223R, 223G, and 223B respectively patterned to correspond to the pixel electrodes 210R, 210G, and 210B and located on the pixel electrodes 210R, 210G, and 210B, the first intermediate layer 221, the second intermediate layer 222, and the opposite electrode 230.

The first intermediate layer 221, the second intermediate layer 222, and the opposite electrode 230 may be located above the pixel electrodes 210R, 210G, and 210B and the pixel definition layer 180 to face the pixel electrodes 210R, 210G, and 210B and the pixel definition layer 180. Portions of the first intermediate layer 221 that correspond to the pixel electrodes 210R, 210G, and 210B may be interposed between the pixel electrodes 210R, 210G, and 210B and the emission layers 223R, 223G, and 223B, and portions of the second intermediate layer 222 that correspond to the pixel electrodes 210R, 210G, and 210B may be located on the emission layers 223R, 223G, and 223B.

The first intermediate layer 221, the second intermediate layer 222, and the opposite electrode 230 may respectively have the first through hole 221b, the second through hole 222b, and the third through hole 230b that correspond to at least a portion of the upper surface of the pixel definition layer 180. The first through hole 221b, the second through hole 222b, and the third through hole 230b may formed by the patterned sacrificial layer 191a as described above. Accordingly, the second through hole 222b and the third through hole 230b may each have a shape corresponding to the first through hole 221b, and an inner surface of the first through hole 221b, an inner surface of the second through hole 222b, and an inner surface of the third through hole 230b may be continuous at boundaries therebetween, and a continuous surface as shown in FIG. 9 may be formed. This is equally applied to embodiments to be described later and modifications thereof.

In an embodiment, the first through hole 221b, the second through hole 222b, and the third through hole 230b may have the same sizes, as illustrated in FIG. 9. In an embodiment, the sizes of the first through hole 221b, the second through hole 222b, and the third through hole 230b may gradually increase or gradually decrease. The inner surfaces of the first through hole 221b, the second through hole 222b, and the third through hole 230b may not be discontinuous at boundaries therebetween, and a continuous surface may be formed. This is equally applied to embodiments to be described later and modifications thereof.

Although the first through hole 221b, the second through hole 222b, and/or the third through hole 230b corresponding to the patterned sacrificial layer 191a may be formed between every two sub pixels in FIG. 9, the first through hole 221b, the second through hole 222b, and/or the third through hole 230b may be formed between only some of the sub-pixels. This is equally applied to embodiments to be described later and modifications thereof.

An organic light-emitting display apparatus according to an embodiment may further include the TFE layer 240 as shown in FIG. 10, and at least a portion of the lower surface of the TFE layer 240 may contact the pixel definition layer 180 via the first through hole 221b, the second through hole 222b, and the third through hole 230b. As the TFE layer 240 may contact the pixel definition layer 180, and bonding power of the TFE layer 240 may increase, the TFE layer 240 may be effectively prevented from being separated from the opposite electrode 230. For example, the pixel definition layer 180 may include an inorganic material such as silicon oxide, silicon nitride, and/or silicon oxynitride, and a lowermost layer of the TFE layer 240 having a multi-layered structure may also be formed of an inorganic material. Thus, bonding power between the TFE layer 240 and the pixel definition layer 180 may increase. As the first through hole 221b, the second through hole 222b, and the third through hole 340b may exist in the lower structure of the TFE layer 240, the area where the lower surface of the TFE layer 240 may contact the lower structure of the TFE layer 240 may increase, and separation of the TFE layer 240 from the opposite electrode 230 may be prevented.

In the organic light-emitting display apparatus manufacturing method according to the embodiment described above with reference to FIGS. 1-8, after the patterned sacrificial layer 191a is formed, for example, the first intermediate layer 221, the emission layers 223R, 223G, and 223B, the second intermediate layer 222, and the opposite electrode 230 may be formed, and then the patterned sacrificial layer 191a may be removed.

Figure 11:
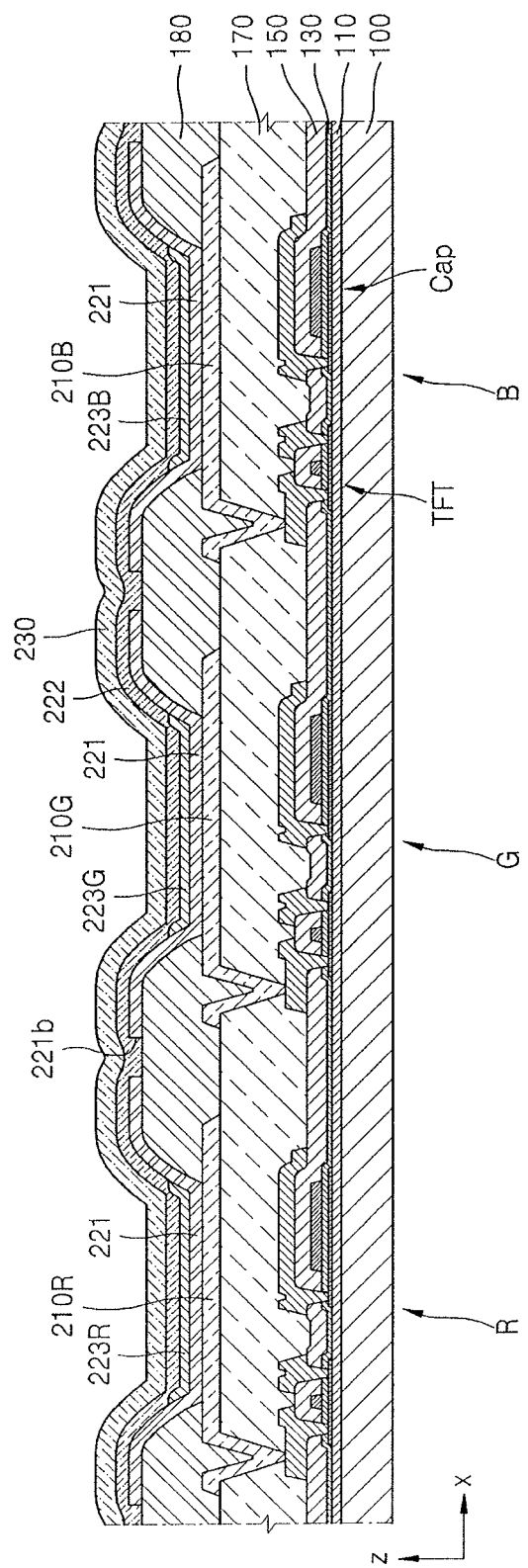
FIG. 11 illustrates a schematic cross-sectional view of an organic light-emitting display apparatus according to an embodiment.

In an organic light-emitting display apparatus manufacturing method according to an embodiment, after the patterned sacrificial layer 191a is formed, the first intermediate layer 221 and the emission layers 223R, 223G, and 223B may be formed, the patterned sacrificial layer 191a may then be removed, and the second intermediate layer 222 and the opposite electrode 230 may then be formed. An organic light-emitting display apparatus according to an embodiment manufactured in this way may have a structure as shown in FIG. 11. Only the first intermediate layer 221 may have the first through hole 221b, and the second intermediate layer 222 and the opposite electrode 230 may have no through holes. Damage of the pixel definition layer 180 or the first intermediate layer 221 due to, for example, contact with the FMM during the formation of the emission layers 223R, 223G, and 223B, may be effectively prevented or minimized, and damage of the first intermediate layer 221 and the emission layers 223R, 223G, and 223B during the removal of the patterned sacrificial layer 191a may be effectively prevented or minimized.

Figure 12:
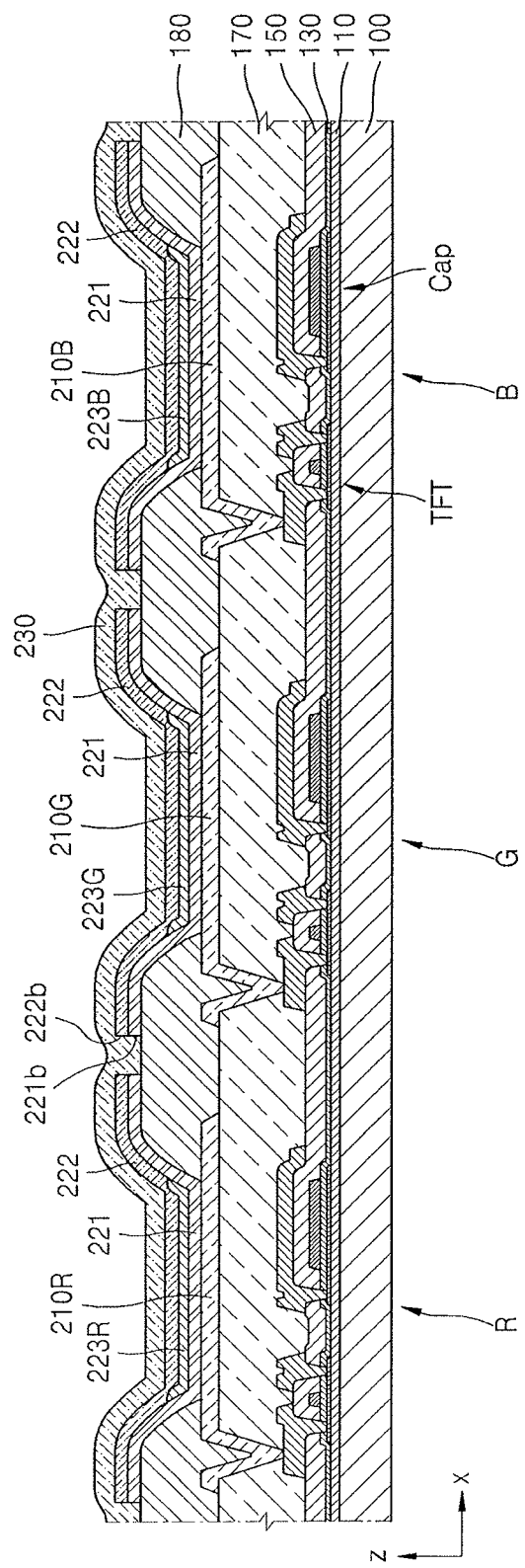
FIG. 12 illustrates a schematic cross-sectional view of an organic light-emitting display apparatus according to an embodiment.

In an organic light-emitting display apparatus manufacturing method according to an embodiment, after the patterned sacrificial layer 191a is formed, the first intermediate layer 221, the emission layers 223R, 223G, and 223B, and the second intermediate layer 222 may be formed, the patterned sacrificial layer 191a may then be removed, and the opposite electrode 230 may then be formed. An organic light-emitting display apparatus according to an embodiment manufactured in this way may have a structure as shown in FIG. 12. Only the first intermediate layer 221 and the second intermediate layer 222 may have the first through hole 221b and the second through hole 222b, respectively, and the opposite electrode 230 may have no through holes. Damage of the pixel definition layer 180 or the first intermediate layer 221 due to, for example, contact with the FMM during the formation of the emission layers 223R, 223G, and 223B, may be effectively prevented or minimized, and damage of the first intermediate layer 221, the second intermediate layer 222, and the emission layers 223R, 223G, and 223B during the removal of the patterned sacrificial layer 191a may be effectively prevented or minimized. In the organic light-emitting display apparatus according to the present embodiment as described above, respective inner surfaces of the first through hole 221b and the second through hole 222b may form a continuous surface.

Figure 13:
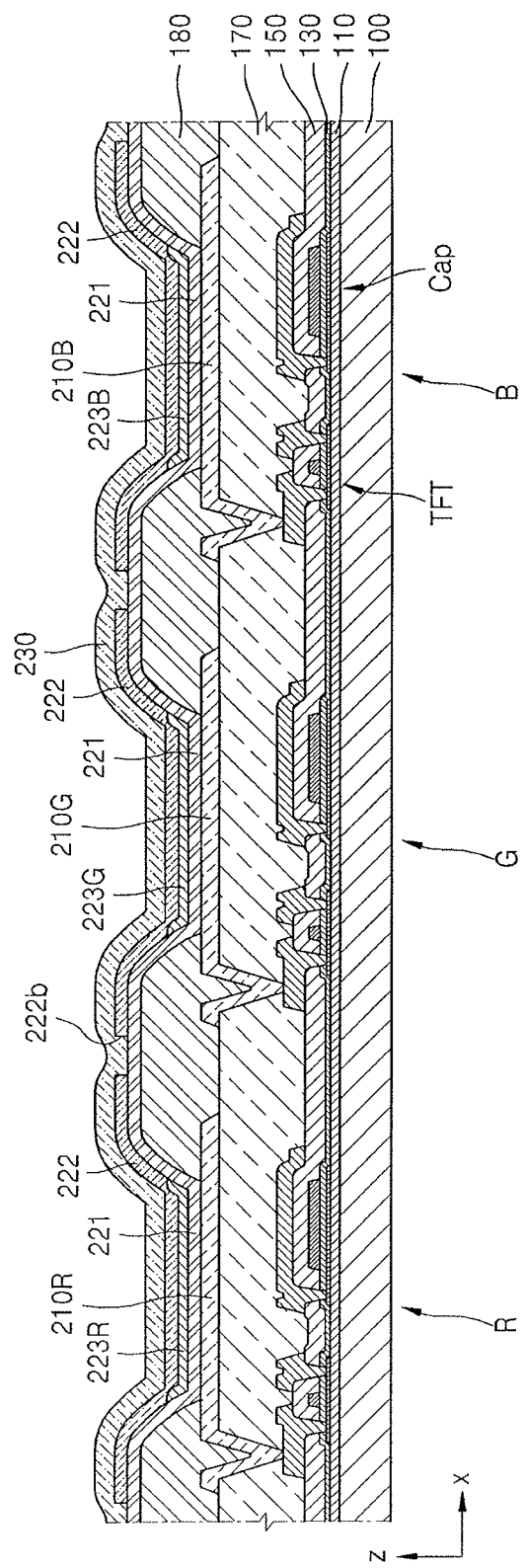
FIG. 13 illustrates a schematic cross-sectional view of an organic light-emitting display apparatus according to an embodiment.

In an organic light-emitting display apparatus manufacturing method according to an embodiment, after the first intermediate layer 221 is formed, the patterned sacrificial layer 191a may be formed. The patterned sacrificial layer 191a may not contact the upper surface of the pixel definition layer 180, and may contact a portion of the first intermediate layer 221 that may be over the upper surface of the pixel definition layer 180, and the first intermediate layer 221 may not have the first through hole 221b. After the patterned sacrificial layer 191a is formed on the first intermediate layer 221, the emission layers 223R, 223G, and 223B and the second intermediate layer 222 may be formed, the patterned sacrificial layer 191a may then be removed, and the opposite electrode 230 may then be formed. An organic light-emitting display apparatus according to an embodiment manufactured in this way may have a structure as shown in FIG. 13. The first intermediate layer 221 and the opposite electrode 230 may not have the first through hole 221b and the third through hole 230b, respectively, and only the second intermediate layer 222 may have the second through hole 222b. Damage of the pixel definition layer 180 or the first intermediate layer 221 due to, for example, contact with the FMM during the formation of the emission layers 223R, 223G, and 223B, may be effectively prevented or minimized, and damage of the first intermediate layer 221, the second intermediate layer 222, and the emission layers 223R, 223G, and 223B during the removal of the patterned sacrificial layer 191a may be effectively prevented or minimized.

Figure 14:
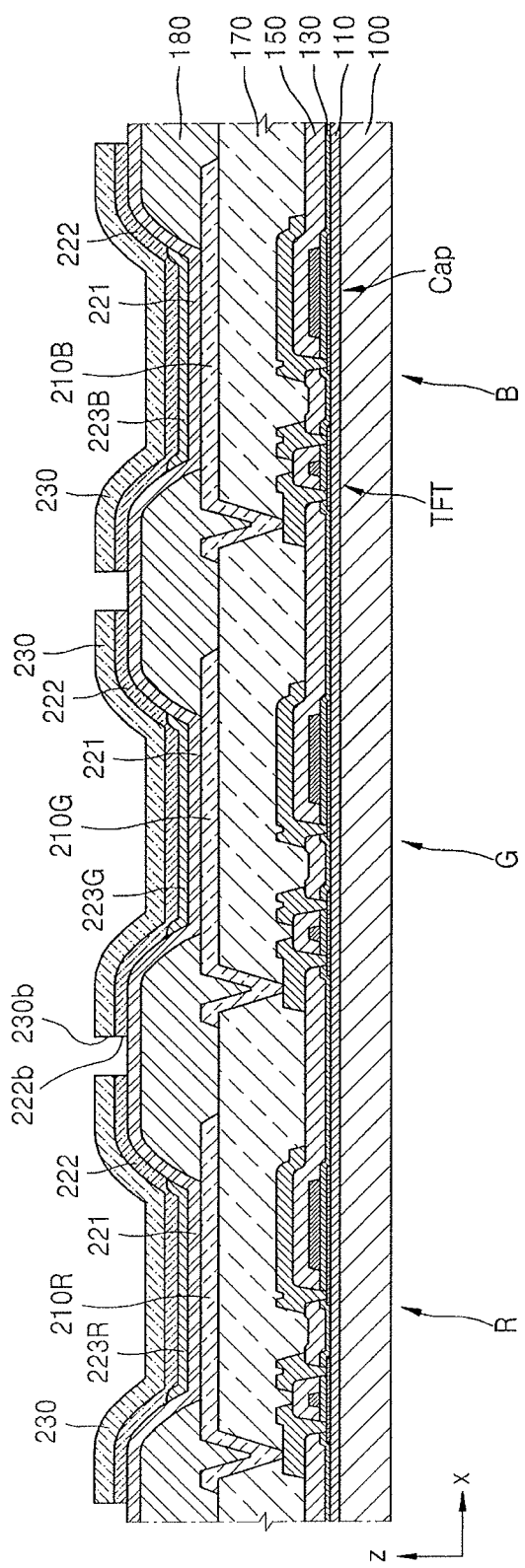
FIG. 14 illustrates a schematic cross-sectional view of an organic light-emitting display apparatus according to an embodiment.

In an organic light-emitting display apparatus manufacturing method according to an embodiment, after the first intermediate layer 221 is formed, the patterned sacrificial layer 191a may be formed, the emission layers 223R, 223G, and 223B, the second intermediate layer 222, and the opposite electrode 230 may then be formed, and the patterned sacrificial layer 191a may then be removed. An organic light-emitting display apparatus according to an embodiment manufactured in this way may have a structure as shown in FIG. 14. The first intermediate layer 221 may not have the first through hole 221b, and only the second intermediate layer 222 and the opposite electrode 230 may have the second through hole 222b and the third through hole 230b, respectively. Damage of the pixel definition layer 180 or the first intermediate layer 221 due to, for example, contact with the FMM during the formation of the emission layers 223R, 223G, and 223B, may be effectively prevented or minimized, and damage of the first intermediate layer 221, the second intermediate layer 222, and the emission layers 223R, 223G, and 223B during the removal of the patterned sacrificial layer 191a may be effectively prevented or minimized. The inner surfaces of the second through hole 222b and the third through hole 230b may form a continuous surface.

In the organic light-emitting display apparatus according to the present embodiment, as show in FIG. 14, the second intermediate layer 222 may have the second through hole 222b, and the opposite electrode 230 may have the third through hole 230b, and. Accordingly, when a TFE layer is formed later, as the second through hole 222b and the third through hole 340b may exist in a lower structure of the TFE layer, the area where the lower surface of the TFE layer may contact the lower structure of the TFE layer may increase, and separation of the TFE layer from the opposite electrode 230 may be prevented.

By way of summation and review, during the manufacturing of an organic light-emitting display apparatus, at least a portion of an intermediate layer may be formed using various methods, for example, a deposition method using an FMM. However, in such a method of manufacturing an organic light-emitting display apparatus, a defect may be generated while at least a portion of an intermediate layer is being formed.

As described above, according to an organic light-emitting display apparatus and a method of manufacturing the same according to the one or more of the above embodiments, a defect generation rate when, for example, an emission layer, is formed may be reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an organic light-emitting display apparatus, the method comprising:
   forming a pixel electrode;
   forming a pixel definition layer covering a portion of an edge of the pixel electrode;
   forming a patterned sacrificial layer to correspond to a portion of an upper surface of the pixel definition layer;
   wherein forming the patterned sacrificial layer includes:
      forming a sacrificial layer to correspond to the pixel electrode and the pixel definition layer; and
      forming the patterned sacrificial layer by forming a photoresist layer on the sacrificial layer and by patterning the sacrificial layer using the photoresist layer;
   forming a first intermediate layer over the pixel electrode and the pixel definition layer;
   forming a patterned emission layer over the first intermediate layer to correspond to the pixel electrode, using the patterned sacrificial layer as a spacer;
   forming a stack of a second intermediate layer and an opposite electrode on the patterned emission layer; and
   removing the patterned sacrificial layer.

2. The method as claimed in claim 1, wherein removing the patterned sacrificial layer includes removing a portion of the photoresist layer remaining on the patterned sacrificial layer by removing the patterned sacrificial layer.

3. The method as claimed in claim 1, further comprising forming the first intermediate layer corresponding to the pixel electrode and the pixel definition layer, the intermediate layer having a first through hole corresponding to the patterned sacrificial layer, between forming the patterned sacrificial layer and forming the patterned emission layer.

4. The method as claimed in claim 3, further comprising forming the second intermediate layer corresponding to the pixel electrode and the pixel definition layer, the intermediate layer having a second through hole corresponding to the patterned sacrificial layer, to cover the patterned emission layer.

5. The method as claimed in claim 4, further comprising forming the opposite electrode corresponding to the pixel electrode and the pixel definition layer, the opposite electrode having a third through hole corresponding to the patterned sacrificial layer, to cover the second intermediate layer.

6. The method as claimed in claim 5, further comprising forming, over the opposite electrode, a thin film encapsulation layer of which a portion of a lower surface directly contacts the pixel definition layer via the first through hole, the second through hole, and the third through hole.

7. The method as claimed in claim 1, wherein the patterned sacrificial layer includes highly-fluorinated resin or fluorinated polymer containing 20 wt % to 60 wt % fluorine.

8. The method as claimed in claim 1, wherein removing the patterned sacrificial layer includes using hydrofluoroethers.

* * * * *